United States Patent [19]
Shimizu

[11] Patent Number: 5,603,570
[45] Date of Patent: Feb. 18, 1997

[54] CONSTANT-TEMPERATURE CONTROL USING SURROUNDINGS TEMPERATURE OF A DEVICE

[75] Inventor: Haruhito Shimizu, Tokyo, Japan

[73] Assignee: NEC Corporation, Japan

[21] Appl. No.: 335,075

[22] Filed: Nov. 7, 1994

[30] Foreign Application Priority Data

Nov. 5, 1993 [JP] Japan .................... 5-276492

[51] Int. Cl.$^6$ .................... G02F 1/015; G01K 1/20
[52] U.S. Cl. .................... 374/100; 364/557; 374/141
[58] Field of Search .................... 374/100, 152, 374/141, 210; 364/557

[56] References Cited

U.S. PATENT DOCUMENTS

| | | | |
|---|---|---|---|
| 4,058,744 | 11/1977 | Dano et al. | 310/343 |
| 4,238,759 | 12/1980 | Hunsperger | 357/28 |
| 4,409,662 | 10/1983 | Rao | 364/557 |
| 4,658,081 | 8/1987 | Richman | 365/1 |
| 4,716,551 | 12/1987 | Inagaki | 365/222 |

FOREIGN PATENT DOCUMENTS 1-243488  9/1989  Japan .

Primary Examiner—Richard Chilcot
Assistant Examiner—Paul D. Amrozowicz
Attorney, Agent, or Firm—Ostrolenk, Faber, Gerb & Soffen, LLP

[57] ABSTRACT

The temperature control of a device incorporated in a module is performed using a device temperature and a surroundings temperature of the device. The device temperature is detected by a device temperature sensor disposed near the device and the surroundings temperature is detected by a surroundings temperature sensor disposed on the module. Using the surroundings temperature when the device is operated, an actual temperature difference between the device temperature and a predetermined control target temperature is estimated based on a predetermined relation between the surroundings temperature and the device temperature detected when desired characteristics of the device are obtained. The device temperature detected when the device is operated is compensated with the estimated temperature difference to adjust the temperature of the device on the predetermined control target temperature.

15 Claims, 5 Drawing Sheets

CONSTANT-TEMPERATURE CONTROL USING SURROUNDINGS TEMPERATURE OF A DEVICE

BACKGROUND OF THE INVENTION

1. Field of the Invention

The present invention relates to temperature control of a device whose characteristics depend on temperature, and more particularly to the constant-temperature control by detecting the device temperature by means of a temperature sensor provided near the device.

2. Description of the Prior Art

Generally, devices such as a semiconductor device change in characteristic depending on temperature. Therefore, constant-temperature control is indispensable for operating such a device stably.

Japanese Patent Laid-open Publication No. HEI 1-243488, for example, discloses a module having a semiconductor laser incorporated therein. Since the semiconductor laser has such a property that its oscillating wavelength shifts depending on temperature, the temperature of the semiconductor laser is kept constant by using a thermistor for temperature detection and a Peltier cooler for temperature adjustment both provided near the semiconductor laser. The constant-temperature control is achieved by the Peltier cooler generating or absorbing heat based on the detected temperature.

However, since a temperature difference exists between the positions of installation of the semiconductor laser and the thermistor, a temperature detected by the thermistor really contains errors therein and does not indicate an actual temperature of the semiconductor laser. Generally, when temperature detection is made by mounting a temperature sensor near a device, it is difficult to eliminate this temperature difference itself drastically. Moreover, this temperature difference results from a difference between the actual temperature and the surroundings temperature of the device and therefore it cannot be discriminated from the detected temperature. This deteriorates accuracy in the temperature control of this kind and becomes a primary factor in a device characteristic shift such as the temperature shift of an oscillating wavelength.

To suppress such a device characteristic shift, there has so far been adopted a construction in which a hold member for supporting the semiconductor laser is made of a high heat conducting material and a thermistor is attached at a position near the semiconductor laser so that the above-described temperature difference can be reduced to a practically negligible degree (see above-described Japanese Patent Laid-open Publication No. HEI 1-243488).

However, if operating surroundings temperature becomes higher or lower than a normal operating range, a difference between the operating surroundings temperature and the control target temperature of the semiconductor laser will be much greater than estimated, so a temperature difference between the detected temperature and the actual temperature of the device will become a very important problem.

Also, if a temperature sensor is mounted at a position adjacent to the semiconductor laser to suppress such a temperature difference, there will occur the need for leaving a space for the temperature sensor near the semiconductor device, and the degree of freedom on the module design will be restricted.

SUMMARY OF THE INVENTION

It is an object of the present invention to provide device temperature control which is capable of performing high-accurate constant temperature control.

Another object of the present invention is to provide device temperature control which is capable of achieving enhanced degree of freedom of installation of a device and a temperature sensor for detecting the device temperature.

The present invention is based on the knowledge that, if an actual temperature of a device is adjacent to a predetermined control target temperature To, a temperature difference $\Delta T$ between the device and the device temperature sensor can be substantially determined as a function of operating surroundings temperature Tc. Therefore, if the relation between the surroundings temperature Tc and the temperature difference $\Delta T$ is measured in advance and stored, an actual temperature difference $\Delta T$ can be obtained from the surroundings temperature Tc detected when the device is operated, and a measurement error in the device temperature resulting from this temperature difference $\Delta T$ can be compensated. In addition, since the measurement of the device temperature can be compensated, the space of installation between the device and the device temperature sensor can be made wider.

The relation between the temperature difference $\Delta T$ and the operating surroundings temperature Tc can be obtained as follows. First, the device is driven so that its desired characteristics are obtained at a surroundings temperature Tc, and the device detection temperature Td at that time is measured by the device temperature sensor. Since, in the condition that the desired characteristics of the device are obtained, the device can be considered to be at a control target temperature To of the device, the temperature difference $\Delta T$ can be obtained easily by calculating the difference between the detection temperature Td detected by the device temperature sensor and the actual device temperature (control target temperature) To. If this relation can be expressed as a function of $\Delta T = F(Tc)$, it may be stored in the form of a function, and if the function form is difficult, the relation may be stored in the form of a table. The Tc—$\Delta T$ relation determined in this way contains temperature characteristics (such as heat conduction loss) inherent to the temperature control mechanism of the device module, and therefore accurate compensation for measurement error becomes possible in operating the device.

BRIEF DESCRIPTION OF THE DRAWINGS

The above and other objects and advantages will become apparent from the following detailed description when read in conjunction with the accompanying drawings wherein.

DETAILED DESCRIPTION OF THE PREFERRED EMBODIMENTS

Figure 1:
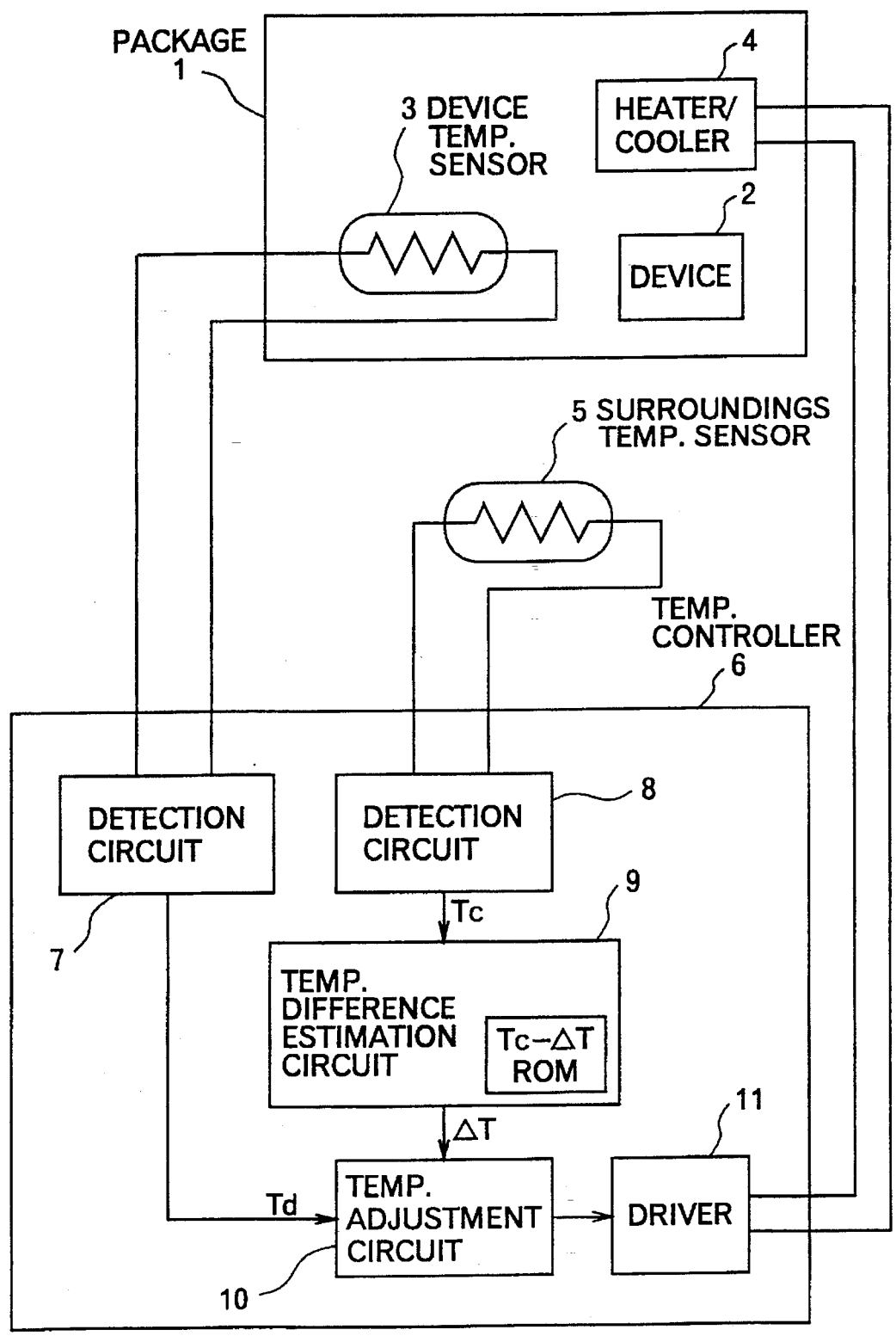
FIG. 1 is a block diagram showing an embodiment of a device temperature control system according to the present invention.

As illustrated in FIG. 1, a package 1 of a device module has incorporated therein a temperature-dependent electronic device 2 such as a semiconductor laser. A temperature sensor 3 for detecting a temperature of this device 2 is disposed near the device 2. Further, a heater/cooler element 4 is provided for adjusting the temperature of the device 2. On the surface of the package 1 there is disposed a surroundings temperature sensor 5 for detecting an operating surroundings temperature. Note that the concrete construction of this module will hereinafter be described (see FIG. 4).

A temperature controller 6 drives the heater/cooler element 4 based on signals detected by the device temperature sensor 3 and the surroundings temperature sensor 5 and performs the constant temperature control of the device. In the temperature controller 6, a detection circuit 7 receives the output of the device temperature sensor 3 and outputs a device detection temperature signal Td. A detection circuit 8 receives the output of the surroundings temperature sensor 5 and outputs a surroundings temperature signal Tc to a temperature difference estimation circuit 9. The temperature difference estimation circuit 9 estimates a temperature difference from the surroundings temperature signal Tc and outputs a temperature difference signal $\Delta T$ to a temperature adjustment circuit 10.

Receiving the device detection temperature signal Td and the temperature difference signal $\Delta T$, the temperature adjustment circuit 10 corrects the device detection temperature signal Td with the temperature difference signal $\Delta T$ and outputs a control signal to a driver 11, the control signal corresponding to an error between the corrected detection temperature and a control target temperature To. The driver 11 supplies a drive current to the heater/cooler element 4 according to the control signal, so that the device 2 is held at a predetermined temperature.

The temperature difference estimation circuit 9 has a read only memory (ROM) storing the relation of Tc—$\Delta T$. Receiving a detected surroundings temperature signal Tc, the circuit 9 outputs a temperature difference data $\Delta T$ between the device control target temperature To and the detection temperature Td received from the detection circuit 7, using the relation of Tc—$\Delta T$ stored in the ROM.

The Tc—$\Delta T$ relation obtained by measurement of the device module has been stored in the form of a function in the ROM provided in the temperature difference estimation circuit 9, as will be described later. The temperature difference $\Delta T$ depends, in a strict sense, on a difference between the operating surroundings temperature Tc and the actual temperature of the device, but it can be expressed approximately by a function of the surroundings temperature Tc, since the actual temperature of the device can be considered constant (To) at heat equilibrium state.

The Tc—$\Delta T$ relation is obtained by the following procedure. Let us assume that X(To) indicates characteristic values of the device 2 as it is held under an idealized condition at the control target temperature To. Measurements are made with regard to the package 1 containing the device 2 and other components.

First, the drive current of the heater/cooler element 4 is adjusted so that the characteristics of the device become desired characteristic values X(To) (e.g., predetermined oscillating wavelength) at a suitable operating surroundings temperature Tc. If the detection temperature detected by the device temperature sensor 3 is expressed in terms of Td(Tc) as the desired characteristic X(To) was obtained, the temperature difference $\Delta T(Tc)$ will be given by the following equation:

$$\Delta T(Tc)=Td(Tc)-To \quad (1).$$

Therefore, the temperature difference $\Delta T$ can be obtained for each surroundings temperature Tc by measuring a device detection temperature Td each time a surroundings temperature Tc is changed. Note that a concrete example will be described later (see FIG. 5).

If the Tc—$\Delta T$ relation obtained in this way is stored in the form of a function in the temperature difference estimation circuit 9, an actual temperature difference $\Delta T$ can be obtained when an actual operating surroundings temperature Tc is detected. Then, a device temperature measurement error resulting from the temperature difference $\Delta T$ can be compensated by the temperature adjustment circuit 10 correcting the device detection temperature Td with the actual temperature difference $\Delta T$.

Figure 2:
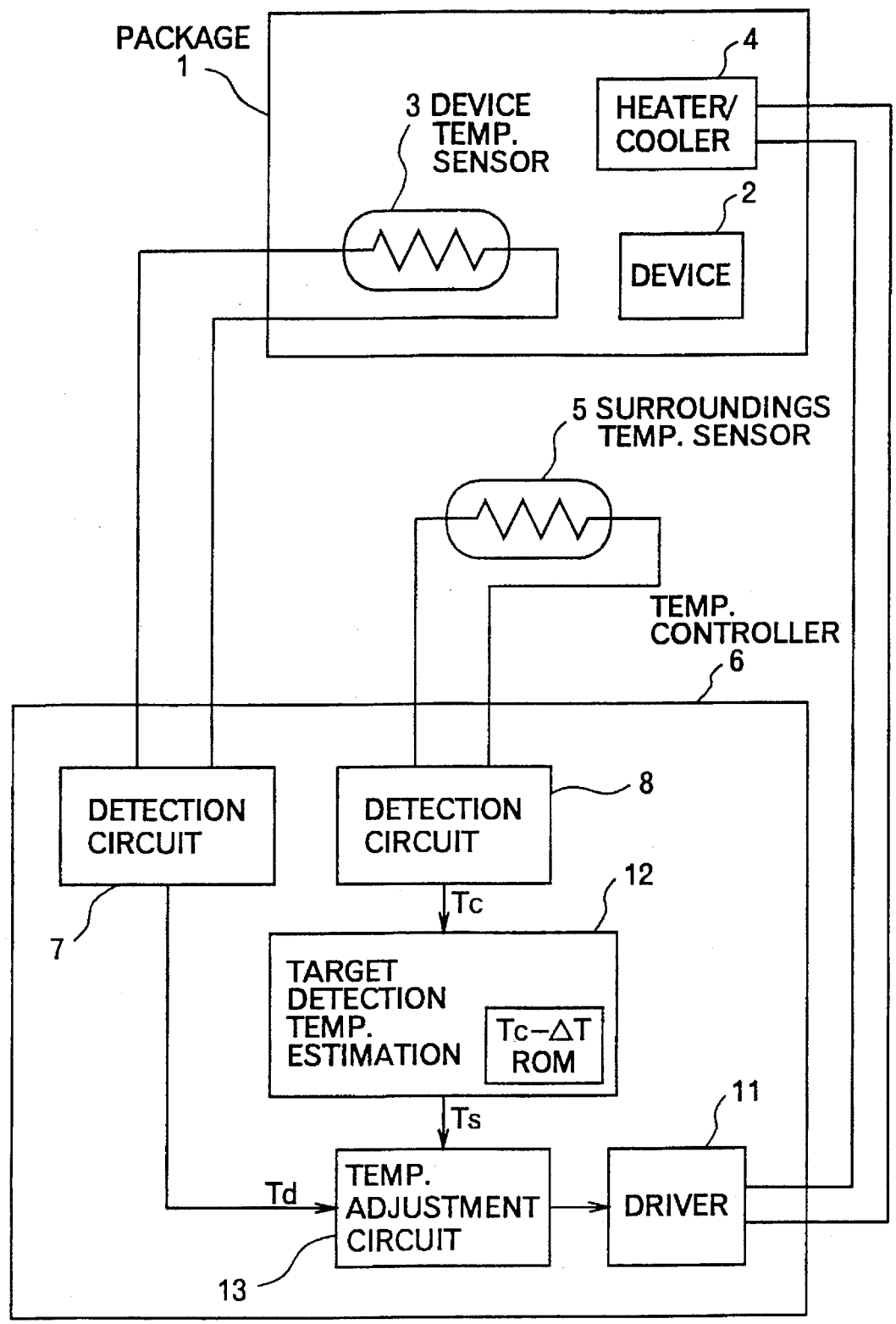
FIG. 2 is a block diagram showing another embodiment of the device temperature control system according to the present invention.

In the second embodiment of the present invention shown in FIG. 2, a device temperature is adjusted not by the temperature difference $\Delta T$ but by a device target detection temperature Ts. A target detection temperature estimation circuit 12 and a temperature adjustment circuit 13 in a temperature controller 6 are therefore different from the first embodiment of FIG. 1.

The target detection temperature estimation circuit 12 receives an operating surroundings temperature Tc and estimates a device target detection temperature Ts. In other words, it calculates an ideal device detection temperature Ts which does not contain an error resulting from the temperature difference $\Delta T$. More particularly, the temperature difference $\Delta T(Tc)$ is obtained from the Tc—$\Delta T$ relation stored in the ROM, and the control target temperature To is then added to the temperature difference $\Delta T$ to calculate the device target detection temperature Ts(Tc). According to Equation (1), $T(Tc)=To+\Delta T(Tc)$. This T(Tc) is used as Ts.

The temperature adjustment circuit 13 outputs an error between a device detection temperature signal Td detected by a temperature sensor 3 and the device target detection temperature signal Ts as a control signal to a drive circuit 11.

Figure 3:
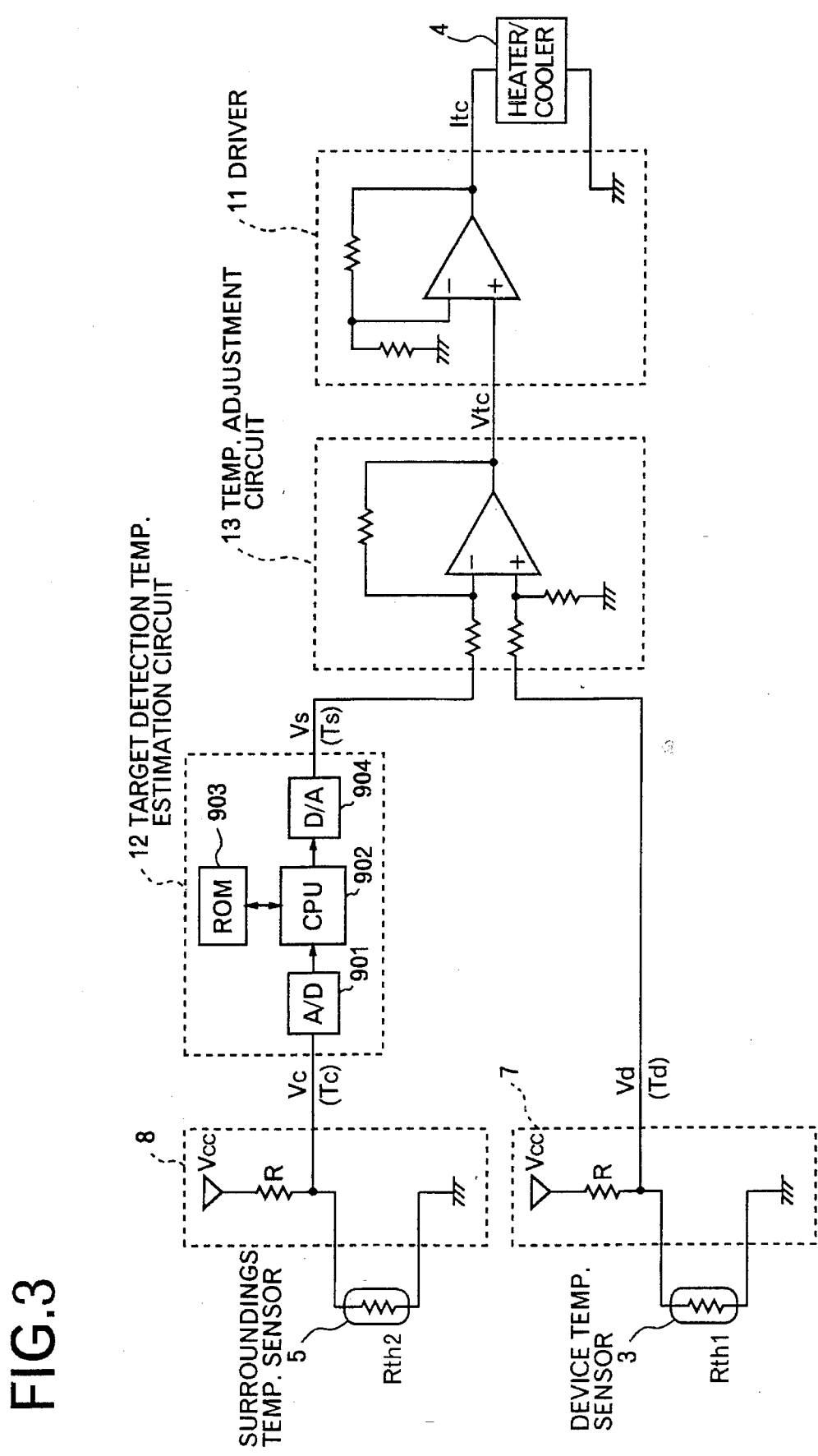
FIG. 3 is a circuit diagram showing a configuration of the embodiment of FIG. 2.

FIG. 3 shows a more concrete circuit of the second embodiment of FIG. 2. Let Rth1 be the value of resistance of the device temperature sensor 3, and let Rth2 be the value of resistance of the surroundings temperature sensor 5. Then, the respective output voltages Vd and Vc of the detection circuits 7 and 8 are given by the following equations:

Vd=Rth1–Vcc/(R+Rth1) and

Vc=Rth2–Vcc/(R+Rth2), where Vd is the voltage indicative of a device detection temperature Td, Vc is the voltage indicative of a surroundings temperature Tc, Vcc is the constant voltage applied to each detection circuit, and R is the resistance value of the resistor provided in each detection circuit.

The target detection temperature estimation circuit 12 comprises an Analog-to-Digital (A/D) converter 901, a computing circuit (CPU) 902, a memory (ROM) 903 storing the relation of Tc—$\Delta T$, and a D/A converter 904. The voltage Vc indicative of the surroundings temperature Tc received from the detection circuit 8 is converted to a digital signal by the A/D converter 901. The CPU 902 calculates temperature difference data ΔT (Tc) corresponding to the surroundings temperature Tc using the relation of Tc—ΔT stored in the ROM 903, and calculates device target detection temperature data Ts by adding a given control target temperature To to the temperature difference data ΔT(Tc). This data is converted to an analog voltage Vs by the D/A converter 904, and the voltage, Vs=Vo+ΔV(Vc), indicative of a device target detection temperature Ts is output to the temperature adjustment circuit 13. Vo is the value of voltage indicative of the control target temperature To, and ΔV(Vc) is the value of voltage indicative of the temperature difference ΔT(Tc).

The temperature adjustment circuit 13 comprises a differential amplifier which outputs a control voltage Vtc corresponding to a difference between the output voltage Vs of the target detection temperature estimation circuit 12 and the output voltage Vd of the detection circuit 7. That is, $$Vtc=A-(Vd-Vs)$$

where A is the amplification factor of the differential amplifier.

Receiving the control voltage Vtc from the temperature adjustment circuit 13, the driver 11 performs a voltage-current conversion and outputs a drive current, Itc=B−Vtc, proportional to the control voltage Vtc to the heater/cooler element 4.

Figure 4:
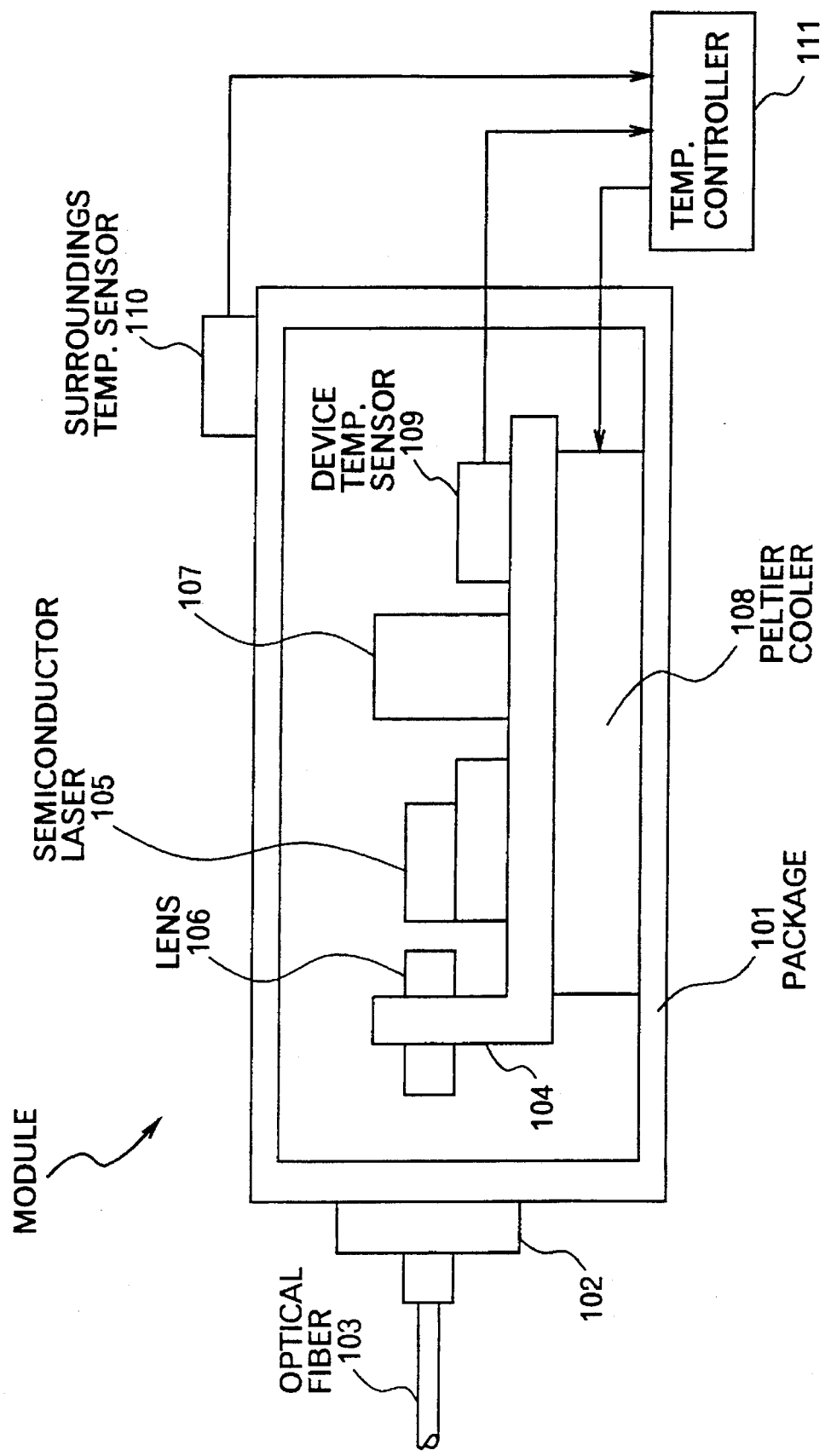
FIG. 4 is a schematic view showing an example of the device module in each of the embodiments of FIGS. 1 and 2.

FIG. 4 schematically illustrates an optical semiconductor module to which the second embodiment of the present invention may be applied. In the figure, reference numeral 101 denotes a package for housing a module assembly circuit. An optical fiber 103 is attached through a supporter 102 to the package 101, and a hold member 104 is fixedly mounted in the package 101.

The hold member 104 has a semiconductor laser 105 and other components attached thereto. The semiconductor laser 105 emits laser light having a predetermined wavelength under the control of an oscillator control circuit (not shown). Forward (in figure, leftward) of the semiconductor laser 105 there is fixed a lens 106 which optically connects the fiber 103 and the semiconductor laser 105. Rearward (in figure, rightward) of the semiconductor laser 105 there is fixed a laser light detection element 107 that detects the laser light from the semiconductor laser 105 for oscillation control. To the lower surface of the hold member 104 there is attached a Peltier cooler 108 which generates or absorbs heat to adjust the temperature of the semiconductor laser 105.

The hold member 104 further has a laser temperature detection thermistor 109 attached thereto. Although it was necessary in the conventional device to dispose the thermistor in the close proximity of the semiconductor laser 105 to make small a temperature difference between the semiconductor laser 105 and the thermistor 109, the thermistor 109 is allowed to be attached at a position spaced a certain degree from the semiconductor laser 105, since in this embodiment such a temperature difference is compensated in a different way. This embodiment therefore has the advantage that the degree of freedom on the module design becomes increased, because the allowable range of the attachment position of the thermistor 109 is enlarged. On the outer surface of the package 101 there is mounted an operating surroundings temperature detection thermistor 110.

A temperature controller 111 receives the detection outputs of the thermistors 109 and 110 and drives the Peltier cooler 108 based on these detection outputs. The temperature controller 111 is identical in basic construction with the temperature controller 6 of FIG. 1 or 2. That is, it receives the detection outputs of the thermistors 109 and 110, performs the above-described constant temperature control, and controls the drive current of the Peltier cooler 108.

Determination of the Tc—ΔT Relation

First, the package 101 having mounted therein various kinds of components such as the semiconductor laser 105, the Peltier cooler 108, and the thermistors 109 and 110 is prepared as a module to be measured, and measurement is made on such a module.

In performing the measurement, the module to be measured is connected to an external verification unit that has the emulation function of the temperature controller 111. In the measurement, the oscillation control circuit first supplies a constant current to the semiconductor laser 105 to have it emit laser light. The drive current of the Peltier cooler 108 is adjusted by the external verification unit so that the oscillating wavelength of the semiconductor laser 105 is identical to a desired reference wavelength. The reference wavelength has been provided in advance as a control target wavelength of the optical semiconductor module.

After the adjustment of the drive current of the Peltier cooler 108 is completed, the operating surroundings temperature Tc and the laser detection temperature Td at that time are recorded. Under an arbitrary operating surroundings temperature, the temperature records (Tc, Td) are collected by performing such measurement verification repeatedly.

Figure 5:
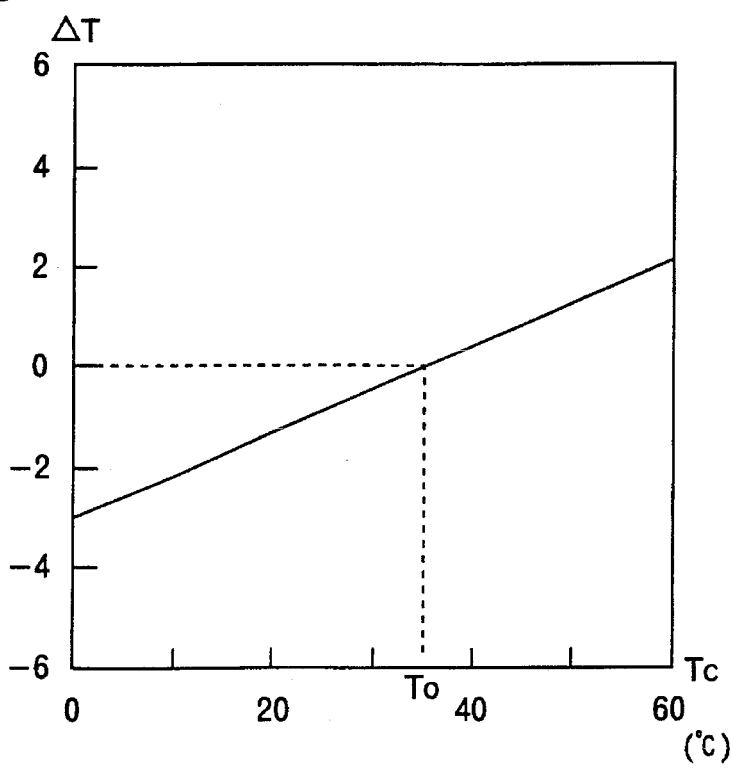
FIG. 5 is a graph showing the relation between an operating surroundings temperature and a temperature difference.

Next, the correlation between surroundings temperature Tc and laser detection temperature Td is obtained based on the records collected in the above-described measurement, and the relation of the temperature difference ΔT (=Td−To) to Tc is derived, as shown in FIG. 5. FIG. 5 shows the case where the oscillating wavelength 1552.0 nm at the time of the laser current 100 mA and the actual laser temperature 35° C. is a reference wavelength.

The Tc—ΔT relation obtained in this way is stored in the form of a function in the ROM provided in the temperature difference estimation circuit 9 or target detection temperature estimation circuit 12. Since in the example shown in FIG. 5 the ΔT varies linearly with the Tc, the ΔT can be expressed as follows:

$$\Delta T=\alpha Tc+\beta$$

where α and β are constants. The device temperature measurement error resulting from the temperature difference ΔT can be eliminated in an actual control of temperature by referring to this function stored in the ROM. When the Tc—ΔT relation to be stored in the ROM cannot be expressed sufficiently as a function, it may also be stored in the form of a table comprising values of Tc and ΔT having necessary accuracy.

In the first embodiment shown in FIG. 1, the surroundings temperature Tc detected by the thermistor 110 (in FIG. 1, surroundings temperature sensor 5) is input to the temperature difference estimation circuit 9, which calculates the temperature difference ΔT(Tc) by using the above-described function stored in the ROM. With this temperature difference ΔT (Tc), the temperature adjustment circuit 10 corrects the detected device temperature Td, and drives the Peltier cooler 108 (in FIG. 1, heat/cooler element 4) through the driver 11, so that the constant temperature control of the device 2 is performed with a high degree of accuracy.

Likewise, in the second embodiment shown in FIG. 2 or 3, the target detection temperature estimation circuit 12 calculates the temperature difference ΔT(Tc) by using the same function, and further calculates the target detection temperature Ts which is output to the temperature adjustment circuit 13. In this case, as in the case of the first embodiment, accurate constant temperature control from which the measurement error resulting from the temperature difference ΔT has been removed can also be executed.

Figure 6:
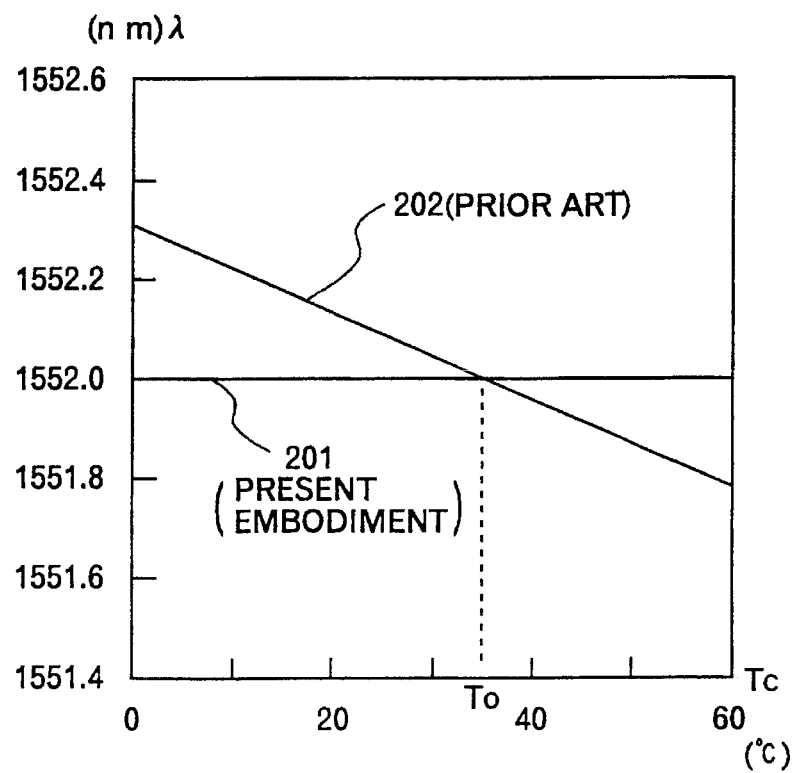
FIG. 6 is a graph showing a change in the oscillating wavelength of the semiconductor laser of FIG. 4 with respect to the operating surroundings temperature.

FIG. 6 illustrates the relation between the laser oscillating wavelength of the module shown in FIG. 4 and the operating surroundings temperature Tc. As shown by a curve 201 in FIG. 6, in the temperature control to which the present invention has been applied, there can be obtained a very robust oscillating characteristic with respect to a change in the operating surroundings temperatures Tc. By contrast, in the method in which the control target temperature To and the device detection temperature Td are compared simply like prior art, as shown by reference numeral 202, the oscillating wavelength varies with the operating surroundings temperature Tc.

As has been described hereinbefore, according to the present invention, using the relation between the operating surroundings temperature Tc and the temperature difference ΔT which is measured and stored in advance, the measurement error resulting from the temperature difference ΔT is compensated. Accordingly, very robust device characteristics with respect to operating surroundings temperatures can be achieved.

In addition, since the measurement error in the device temperature is compensated, the space of installation between the device and the device temperature sensor can be made wider, resulting in increased degree of freedom on the module design.

While the subject invention has been described with relation to the preferred embodiments, various modifications and adaptations thereof will now be apparent to those skilled in the art. All such modifications and adaptations as fall within the scope of the appended claims are intended to be covered thereby.

What is claimed is:

1. A temperature control method of a device incorporated in a module, comprising the steps of:

detecting a device temperature when the device is operated, the device temperature being detected by a first sensor provided near the device;

detecting a surroundings temperature of the device when the device is operated, the surroundings temperature being detected by a second sensor provided to the module;

estimating a temperature difference between the device temperature and a predetermined control target temperature, based on the surroundings temperature and a predetermined correlation between the surroundings temperature and the device temperature detected when desired characteristics of the device are obtained;

compensating the device temperature detected when the device is operated with the temperature difference; and adjusting the temperature of the device on the predetermined control target temperature based on the compensated device temperature;

the predetermined correlation is obtained by the steps of:

assembling the module including the device, the first sensor, the second sensor, and a temperature adjustment element for adjusting the temperature of the device at a predetermined arrangement;

driving the temperature adjustment element so that the characteristics of the device become consistent with the desired characteristics under a plurality of surroundings temperatures;

detecting the device temperature using the first sensor each time the characteristics of the device are consistent with the desired characteristics at each surroundings temperature; and determining the correlation between the surroundings temperature and the device temperature.

2. The method as set forth in claim 1, wherein the step of estimating the temperature difference includes the steps of:

subtracting the predetermined control target temperature from the device temperature of the predetermined correlation to obtain a relation between the temperature difference and the surroundings temperature; and estimating the temperature difference using the relation and the surroundings temperature when the device is operated.

3. The method as set forth in claim 2, wherein the relation is expressed by a function formula.

4. A temperature control method of a device incorporated in a module, comprising the steps of:

detecting a device temperature when the device is operated, the device temperature being detected by a first sensor provided near the device;

detecting a surroundings temperature of the device when the device is operated, the surroundings temperature being detected by a second sensor provided to the module;

estimating a temperature difference between the device temperature and a predetermined control target temperature, based on the surroundings temperature and a predetermined correlation between the surroundings temperature and the device temperature detected when desired characteristics of the device are obtained;

compensating the device temperature detected when the device is operated with the temperature difference; and adjusting the temperature of the device on the predetermined control target temperature based on the compensated device temperature;

the step of estimating the temperature difference includes the steps of:

subtracting the predetermined control target temperature from the device temperature of the predetermined correlation to obtain a relation between the temperature difference and the surroundings temperature; and estimating the temperature difference based on the relation and the surroundings temperature when the device is operated.

5. The method as set forth in claim 4, wherein the relation is expressed by a function formula.

6. A temperature control system of a device incorporated in a module, comprising:

first detecting means provided near the device for detecting a device temperature;

second detecting means provided to the module for detecting a surroundings temperature of teh device;

estimating means for estimating a temperature difference between the device temperature detected by the first detecting means and predetermined control target temperature, based on the surroundings temperature detected when the device is operated and a predetermined correlation between the surroundings temperature and the device temperature detected when desired characteristics of the device are obtained; and adjusting means for adjusting the temperature of the device to the predetermined control target temperature, based on the device temperature compensated with the estimated temperature difference;

the module including a housing containing the device and the first detecting means, and the second detecting means is provided on the surface of the module.

7. A temperature control system of a device incorporated in a module, comprising:

first detecting means provided near the device for detecting a device temperature;

second detecting means provided to the module for detecting a surroundings temperature of the device;

estimating means for estimating a temperature difference between the device temperature detected by the first detecting means and predetermined control target temperature, based on the surroundings temperature detected when the device is operated and a predetermined correlation between the surroundings temperature and the device temperature detected when desired characteristics of the device are obtained; and adjusting means for adjusting the temperature of the device to the predetermined control target temperature, based on the device temperature compensated with the estimated temperature difference; the estimating means including:

storage means for storing a relation between the temperature difference and the surroundings temperature, the temperature difference being obtained by subtracting the predetermined control target temperature from the device temperature of the predetermined correlation; and readout means for reading out the temperature difference from the storage means according to the surroundings temperature detected when the device is operated.

8. The temperature control system as set forth in claim 7, wherein the module includes a housing containing the device and the first detecting means, and the second detecting means is provided on the surface of the module.

9. A temperature control system of a device incorporated in a module, comprising:

first detecting means provided near the device for detecting a device temperature;

second detecting means provided to the module for detecting a surroundings temperature of the device;

estimating means for estimating a temperature difference between the device temperature detected by the first detecting means and predetermined control target temperature, based on the surroundings temperature detected when the device is operated and a predetermined correlation between the surroundings temperature and the device temperature detected when desired characteristics of the device are obtained; and adjusting means for adjusting the temperature of the device to the predetermined control target temperature, based on the device temperature compensated with the estimated temperature difference the estimating means including:

storage means for storing a function formula expressing a relation between the temperature difference and the surroundings temperature, the temperature difference being obtained by subtracting the predetermined control target temperature from the device temperature of the predetermined correlation; and calculation means for calculating the temperature difference using the function formula stored in the storage means and the surroundings temperature detected when the device is operated.

10. The temperature control system as set forth in claim 9, wherein the module includes a housing containing the device and the first detecting means, and the second detecting means is provided on the surface of the module.

11. A temperature control system of a device incorporated in a module, comprising:

first detector provided near the device for detecting a device temperature;

second detector provided to the module for detecting a surroundings temperature of the device;

estimating device to estimate a temperature difference between the device temperature detected by the first detector and a predetermined control target temperature, based on the surroundings temperature detected when the device is operated and a predetermined correlation between the surroundings temperature and the device temperature detected when desired characteristics of the device are obtained; and adjusting device to adjust the temperature of the device to the predetermined control target temperature, based on the device temperature compensated with the estimated temperature difference;

the module includes a housing containing the device and the first detector and the second detector is provided on the surface of the module.

12. A temperature control system of a device incorporated in a module, comprising:

first detector provided near the device for detecting a device temperature;

second detector provided to the module for detecting a surroundings temperature of the device;

estimating device to estimate a temperature difference between the device temperature detected by the first detector and a predetermined control target temperature, based on the surroundings temperature detected when the device is operated and a predetermined correlation between the surroundings temperature and the device temperature detected when desired characteristics of the device are obtained; and adjusting device to adjust the temperature of the device to the predetermined control target temperature, based on the device temperature compensated with the estimated temperature difference;

the estimating device including:

storage device for storing a relation between the temperature difference and the surroundings temperature, the temperature difference being obtained by subtracting the predetermined control target temperature from the device temperature of the predetermined correlation; and readout device for reading out the temperature difference from the storage device according to the surroundings temperature detected when the device is operated.

13. The temperature control system as set forth in claim 12, wherein the module includes a housing containing the device and the first detector, and the second detector is provided on the surface of the module.

14. A temperature control system of a device incorporated in a module, comprising:

first detector provided near the device for detecting a device temperature;

second detector provided to the module for detecting a surroundings temperature of the device;

estimating device to estimate a temperature difference between the device temperature detected by the first detector and a predetermined control target temperature, based on the surroundings temperature detected when the device is operated and a predetermined correlation between the surroundings temperature and the device temperature detected when desired characteristics of the device are obtained; and adjusting device to adjust the temperature of the device to the predetermined control target temperature, based on the device temperature compensated with the estimated temperature difference;

the estimating device including:

storage device for storing a function formula expressing a relation between the temperature difference and the surroundings temperature, the temperature difference being obtained by subtracting the predetermined control target temperature from the device temperature of the predetermined correlation; and calculation device for calculating the temperature difference using the function formula stored in the storage device and the surroundings temperature detected with the device is operated.

15. The temperature control system as set forth in claim 14, wherein the module includes a housing containing the device and the first detector and the second detector is provided on the surface of the module.

* * * * *